US012591085B2

(12) United States Patent
Wang et al.

(10) Patent No.: US 12,591,085 B2
(45) Date of Patent: Mar. 31, 2026

(54) GALLIUM NITRIDE NANO SUPERSTRUCTURE AND PREPARATION METHOD THEREOF AND GALLIUM NITRIDE-BASED LASER

(71) Applicant: Suzhou Institute of Nano-Tech and Nano-Bionics (SINANO), CAS, Suzhou (CN)

(72) Inventors: Miao Wang, Suzhou (CN); Juemin Yi, Suzhou (CN); Jianfeng Wang, Suzhou (CN); Ke Xu, Suzhou (CN)

(73) Assignee: Suzhou Institute of Nano-Tech and Nano-Bionics (Sinano), CAS, Suzhou (CN)

( * ) Notice: Subject to any disclaimer, the term of this patent is extended or adjusted under 35 U.S.C. 154(b) by 554 days.

(21) Appl. No.: 18/043,052

(22) PCT Filed: Oct. 17, 2022

(86) PCT No.: PCT/CN2022/125543
§ 371 (c)(1),
(2) Date: Feb. 27, 2023

(87) PCT Pub. No.: WO2023/130794
PCT Pub. Date: Jul. 13, 2023

(65) Prior Publication Data
US 2024/0288617 A1 Aug. 29, 2024

(30) Foreign Application Priority Data
Jan. 5, 2022 (CN) .......................... 202210009700.1

(51) Int. Cl.
*G02B 5/30* (2006.01)
*H01S 5/02212* (2021.01)

*H01S 5/024* (2006.01)
*H01S 5/323* (2006.01)

(52) U.S. Cl.
CPC ............ *G02B 5/3058* (2013.01); *H01S 5/323* (2013.01); *G02B 2207/101* (2013.01); *H01S 5/02212* (2013.01); *H01S 5/02469* (2013.01)

(58) Field of Classification Search
None
See application file for complete search history.

(56) References Cited

FOREIGN PATENT DOCUMENTS

| | | | | |
|---|---|---|---|---|
| CN | 103383980 B | * | 1/2016 | |
| CN | 113795985 A | * | 12/2021 | ......... H01S 5/18361 |

* cited by examiner

*Primary Examiner* — Richard H Kim
(74) *Attorney, Agent, or Firm* — Wang Law Firm, Inc.

(57) ABSTRACT

The present invention relates to a gallium nitride nano superstructure and a preparation method thereof. The gallium nitride nano superstructure is used for realizing circularly polarized light output of the gallium nitride-based laser. The gallium nitride nano superstructure comprises, from bottom to top, a substrate, a dielectric film layer and a nano-grating structure layer, a grating material of the nano-grating structure layer comprising one of gallium nitride, N-type gallium nitride and P-type gallium nitride, a grating period being in a range of 100 nm-280 nm, a grating height being in a range of 100 nm-300 nm, and a grating line width being in a range of 50 nm-200 nm. The gallium nitride nano superstructure of the present invention can be applied to a gallium nitride-based laser to realize the circularly polarized light output of the gallium nitride-based laser.

4 Claims, 11 Drawing Sheets

GALLIUM NITRIDE NANO SUPERSTRUCTURE AND PREPARATION METHOD THEREOF AND GALLIUM NITRIDE-BASED LASER

The present invention claims priority to Chinese Patent Invention No. 202210009700.1, entitled "Gallium Nitride Nano Superstructure and Preparation Method Thereof and Gallium Nitride-Based Laser", filed with CNIPA on Jan. 5, 2022, the entire contents of which are incorporated herein by reference.

TECHNICAL FIELD

The present invention relates to the field of micro-nano manufacturing technology, and in particular to a gallium nitride nano superstructure for realizing circularly polarized light output of a gallium nitride-based laser, a preparation method thereof, and a gallium nitride-based laser.

BACKGROUND ART

Gallium nitride-based blue-green laser has been widely used in laser display, laser projection, visible light communication, etc. by virtue of high light efficiency, narrow line width and high color rendering index. If further used in the fields of holographic display, biological imaging, underwater optical communication, quantum communication, etc. gallium nitride-based lasers, which are themselves outputting linearly polarized light, need to be converted into circularly polarized radiation by adding specific optical elements, such as quarter-wave plates. In general, the quarter-wave band used for obtaining circularly polarized light is a lens of a bulk material, the thickness of which is usually on the millimeter level, the volume of which is large in an optical system, and the development of integration and miniaturization of devices is not utilized, and in particular, it cannot be used in a compact miniature projector or a head-mounted display. The method of realizing wave plate function based on micro-nano structure provides the possibility to realize laser device miniaturization and on-chip integration. N. F. Yu etc. used metal grating structure to realize circularly polarized light-emitting laser in mid-infrared band based on surface plasmon effect.

The use of quarter-wave plate made of bulk material on gallium nitride-based blue-green laser can achieve circularly polarized light. but the overall volume is large, which is not conducive to high integration and miniaturization. The biggest problem of using metal grating to prepare circularly polarized light-emitting laser is the large absorption loss of metal, which leads to the low energy efficiency of the light.

The information disclosed in this background art section is intended merely to enhance an understanding of the general background of the present invention and should not be construed as an admission or any form of suggestion that such information constitutes prior art that is known to one of ordinary skill in the art.

SUMMARY OF THE INVENTION

It is an object of the present invention to provide a gallium nitride nano superstructure capable of realizing a high-efficiency circularly polarized light output function, which can be applied to a gallium nitride-based laser to realize the circularly polarized light output of the gallium nitride-based laser.

In order to achieve the above-mentioned object, an embodiment of the present invention provides a gallium nitride nano superstructure for realizing circularly polarized light output of a gallium nitride-based laser, wherein the gallium nitride nano superstructure comprises, from bottom to top, a substrate, a dielectric film layer and a nano-grating structure layer. A grating material of the nano-grating structure layer comprising one of gallium nitride, N-type gallium nitride and P-type gallium nitride. A grating period is in a range of 100 nm-280 nm, a grating height is in a range of 100 nm-300 nm, and a grating line width is in a range of 50 nm-200 nm.

In one or more embodiments of the present invention, a substrate material of the gallium nitride nano superstructure comprises gallium nitride or sapphire.

In one or more embodiments of the present invention, a material of the dielectric film layer of the gallium nitride nano superstructure comprises one of gallium nitride, N-type gallium nitride and P-type gallium nitride, and a thickness of the dielectric film layer ranges from 0.1 $\mu$m to 100 $\mu$m.

In one or more embodiments of the present invention, the gallium nitride nano superstructure has a size of 10-1000 $\mu$m and a profile shape comprising a circle or a square.

The present invention also provides a preparation method of a gallium nitride nano superstructure for realizing circularly polarized light output of a gallium nitride-based laser, comprising the following steps: growing a gallium nitride film or N-type gallium nitride film or P-type gallium nitride film on a sapphire substrate; spin coating a photoresist on the film, photoetching and developing to prepare a photoresist grating pattern; preparing a metal grating mask structure; and etching the gallium nitride film or N-type gallium nitride film or P-type gallium nitride film to form a gallium nitride grating, and etching an excess metal grating.

The present invention also provides a preparation method of a gallium nitride nano superstructure for realizing circularly polarized light output of a gallium nitride-based laser, comprising the following steps: spin coating a photoresist on a gallium nitride substrate, and photoetching and developing to prepare a photoresist grating pattern; preparing a metal grating mask structure; and etching the gallium nitride substrate to form a gallium nitride grating, and etching an excess metal grating.

In one or more embodiments of the present invention, a thickness of the photoresist is in a range of 100-300 nm, and a photolithography method comprises electron beam exposure, ultraviolet direct writing, and double beam interference.

In one or more embodiments of the present invention, the step of preparing a metal grating mask structure comprises: evaporating a film of metallic nickel or chromium or nickel plus chromium to a thickness of 30-80 nm, and stripping residual photoresist by immersion in acetone to form a grating of a metallic nickel or chromium or nickel+chromium material.

In one or more embodiments of the present invention, the step of etching to form a gallium nitride grating, and etching an excess metal grating comprises: using ICP dry etching technology to perform etching, with an depth of etching grating being 100 nm-300 nm, using a chromium etching solution and/or nickel etching solution to wash away excess chromium and/or nickel, and using deionized water to perform ultrasonic cleaning.

The present invention also provides a gallium nitride-based laser comprising a gallium nitride-based laser body and the gallium nitride nano superstructure mentioned above, wherein the gallium nitride nano superstructure is arranged at a front end of a light-emitting end face of the gallium nitride-based laser body, and an included angle between a wire grid direction of the gallium nitride nano superstructure grating and a polarization direction of the light-emitting of the gallium nitride-based laser body is 45°.

Compared with the prior art, the gallium nitride nano superstructure of the embodiments of the present invention can achieve a high-efficiency circularly polarized light output function. When applying the gallium nitride nano super-structure of the present invention to a gallium nitride-based laser, the circularly polarized light output of the gallium nitride-based laser can be achieved. Due to its own charac-teristics, gallium nitride-based lasers emit highly linearly polarized light. By integrating gallium nitride nano super-structure at the front end of the light-emitting surface and changing the positive and negative relationship between the nano-grating wire grid and the laser polarization direction, left-handed circularly polarized light and right-handed cir-cularly polarized light are emitted.

The gallium nitride nano superstructures of the embodi-ments of the present invention have high light transmittance and high polarization conversion efficiency. There is no absorption of gallium nitride nano superstructure in the visible light band, and the preparation of nano-grating structure on the surface can effectively reduce the low light output efficiency caused by the large refractive index dif-ference with air. Therefore, high transmittance can be achieved for the radiation of gallium nitride-based lasers. In addition, by designing reasonable nano superstructure parameters, the function of quarter-wave plate is realized, and the laser with high linear polarization degree is effi-ciently converted into circularly polarized radiation laser with minimal energy loss.

The gallium nitride nano superstructure of the embodi-ment of the present invention has a high degree of integra-tion and a high stability. Gallium nitride nano superstructure, which are designed to have a nanostructure thickness on the order of a hundred nanometers, together with a substrate thickness on the order of a hundred micrometers, provides great convenience in achieving highly integrated compact devices. In addition, the gallium nitride material itself has high hardness, is resistant to radiation, is resistant to high temperature and is not easily decomposed, so the prepared gallium nitride nano superstructure has better stability and can maintain good physical properties under extreme con-ditions such as space, deep sea and high temperature envi-ronment.

DETAILED DESCRIPTION OF THE INVENTION

Detailed description will now be made to the particular embodiments of the present invention with reference to the drawings, and it is to be understood that the scope of protection of the present invention is not limited to the particular embodiments.

Throughout the description and the claims, unless the context requires otherwise, the word "comprise", or varia-tions such as "comprises" or "comprising", will be under-stood to imply the inclusion of a stated element or compo-nent but not the exclusion of any other element or component.

As noted in the background, gallium nitride-based lasers perform linearly polarized light output and have a high degree of polarization. There are also various solutions for realizing circularly polarized light in the prior art, and it is conventional to directly use an optical ¼wave plate to realize the conversion of circular polarization. However, such a wave plate is large in size and difficult to be integrated. According to the basic characteristics of the gallium nitride-based laser, the present invention innova-tively proposes to use a gallium nitride nano superstructure to realize that the gallium nitride-based laser emits light converted from its linear polarization to circular polariza-tion.

Example 1

Figure 1:
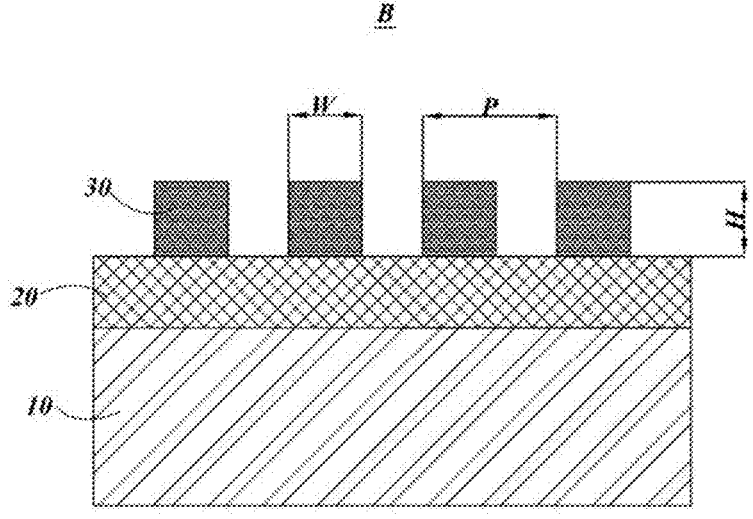
FIG. 1 is a cross-sectional view of a gallium nitride nano superstructure according to an embodiment of the present invention.
Figure 2:
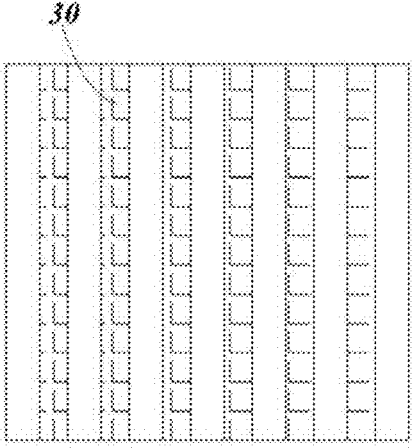
FIG. 2 is a top view of the gallium nitride nano super-structure of Example 1 of the present invention.

As shown in FIGS. 1 and 2, an embodiment of the present invention provides a gallium nitride nano superstructure B for integrating on a gallium nitride-based laser chip to realize circularly polarized light output of the gallium nitride-based laser, wherein the gallium nitride nano super-structure comprises a substrate 10, a dielectric film layer 20 and a nano-grating structure layer 30 from bottom to top. The size of the gallium nitride nano superstructure is 10-1000 μm, and the contour shape may be circular or square. The substrate 10 of the gallium nitride nano super-structure is one of gallium nitride or sapphire. A material of the dielectric film layer 20 is one of gallium nitride or N-type gallium nitride or P-type gallium nitride and has a thickness in the range of 0.1 μm to 100 μm. In a nano-grating structure layer 30 of gallium nitride nano superstructure, the grating material is one of gallium nitride or N-type gallium nitride or P-type gallium nitride, a grating period P ranges from 100 nm to 280 nm, a grating height H ranges from 100 nm to 300 nm, and a grating line width W ranges from 50 nm to 200 nm. The function of the gallium nitride nano superstructure is to convert incident linearly polarized laser light through the structure device into circularly polarized light for output, which is functionally equivalent to a quarter-wave plate.

Example 2

Figure 3:
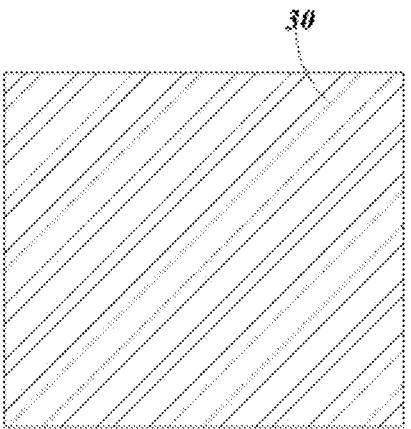
FIG. 3 is a top view of the gallium nitride nano super-structure of Example 2 of the present invention.

Since the above-mentioned gallium nitride nano super-structure is used for an integrated gallium nitride-based laser, a line grating direction of the prepared nano-grating structure layer 30 should maintain an angle of 45° with a radiation polarization direction of the laser chip, in order to simplify the step of integrating the gallium nitride nano superstructure into the gallium nitride-based laser. When a profile of the prepared gallium nitride nano superstructure is square, a nano-grating structure layer 30 oriented at 45° with a straight edge of the substrate can be directly prepared on the dielectric film layer 20, as shown in FIG. 3.

Figure 4:
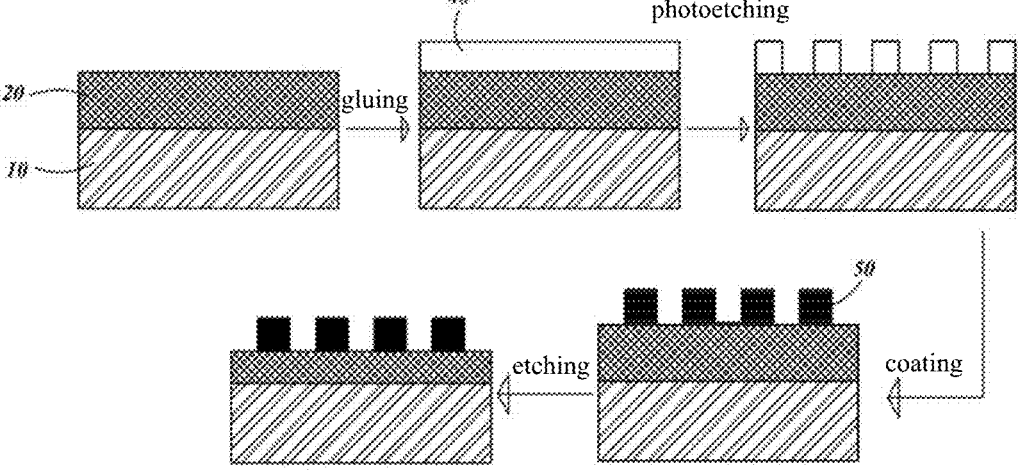
FIG. 4 is a schematic flow diagram of a preparation method of a gallium nitride nano superstructure in accor-dance with one embodiment of the present invention.

With reference to FIG. 4. the present invention also provides a preparation method of a gallium nitride nano superstructure for realizing circularly polarized light output of a gallium nitride-based laser, comprising: selecting a sapphire substrate, and growing a gallium nitride or N-type gallium nitride or P-type gallium nitride film 20 on the sapphire substrate 10 (if the gallium nitride substrate is selected, this step can be skipped with directly proceeding to the next step). A photoresist 40 is spin-coated on the above-mentioned substrate 10 or film 20 with a photoresist thickness in a range of 100-300 nm, and the photoresist grating pattern is prepared by performing photolithography and development via any one of the methods of electron beam exposure or ultraviolet direct writing or double-beam interference. A film of metallic nickel or chromium or nickel+chromium is evaporated to a thickness of 30-80 nm, and then the residual photoresist is stripped by immersion in acetone to form a grating 50 of metallic nickel or chromium or nickel+chromium material. The sample is etched with ICP dry etching technology, a depth of etching grating is 100 nm-300 nm, then excess chromium and/or nickel are washed away with chromium etching solution and/or nickel etching solution, and the sample is ultrasonically cleaned with deionized water.

The prepared gallium nitride nano superstructure and the gallium nitride-based laser are integrated a the front end of the light-emitting end face of the laser by means of bonding or optical bonding or combining with a light-emitting hole of an encapsulation cap, and an angle between a direction of the grating and the polarization direction of the light-emitting of the laser is 45°. In order to simplify the integration step, when the substrate is square, a grating oriented at 45° may be prepared on the square substrate when preparing the grating on the substrate or film for integration. When the substrate is circular, there is no such requirement but the grating direction needs to be marked for integration.

Example 3

Figure 5A:
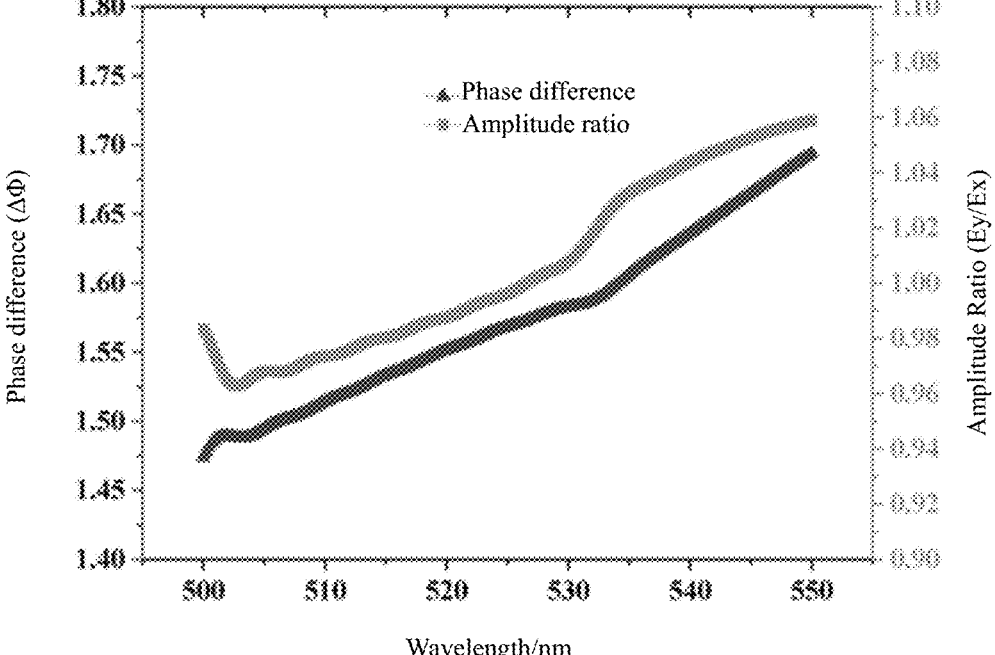
FIG. 5a and FIG. 5b are transmission line and phase difference vs. amplitude ratios, respectively, of the gallium nitride nano superstructure prepared in Example 3 of the present invention in a wide spectral band of green light.
Figure 5B:
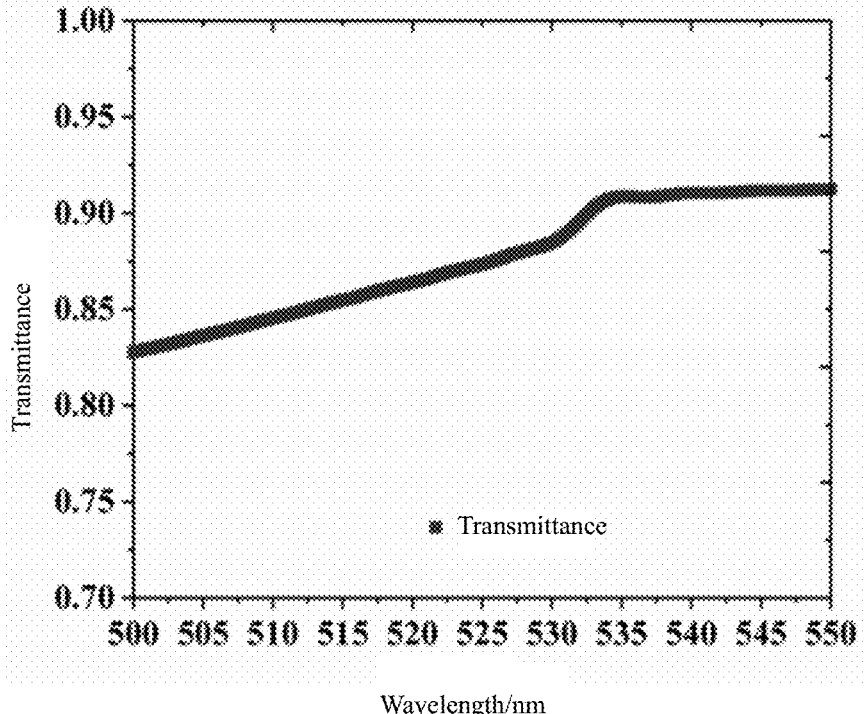

The photoresist is first spin-coated for 200 nm directly on a GaN film or GaN single crystal substrate grown on the sapphire substrate 10. A grating pattern having a period of 220 nm and a width of 140 nm is exposed using electron beam lithography or dual beam ultraviolet light and developed. Chromium metal is evaporated on the above-mentioned structure by using electron beam evaporation or magnetron sputtering to a thickness of 50 nm, and the photoresist structure is removed by immersion in acetone and ultrasound, and the width of the chromium metal grating is 80 nm. The gallium nitride is etched with dry etching (ICP) to a depth of 225 nm and a width of 80 nm, and the residual chromium is washed away using a chromium etching solution. The transmission line and phase difference vs. amplitude ratios of the prepared gallium nitride supernano structure in the green wide spectral band are shown in FIG. 5a and FIG. 5b.

Example 4

Figure 6A:
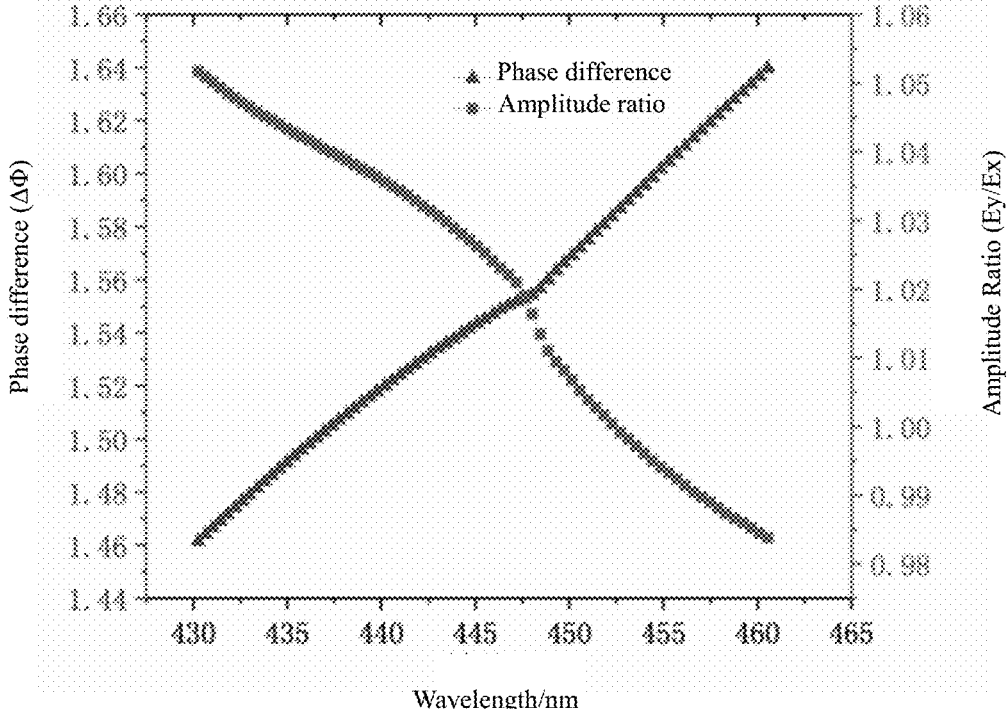
FIG. 6a and FIG. 6b are transmission line and phase difference vs. amplitude ratios, respectively, of the gallium nitride nano superstructure prepared in Example 4 of the present invention in a wide spectral band of green light.
Figure 6B:
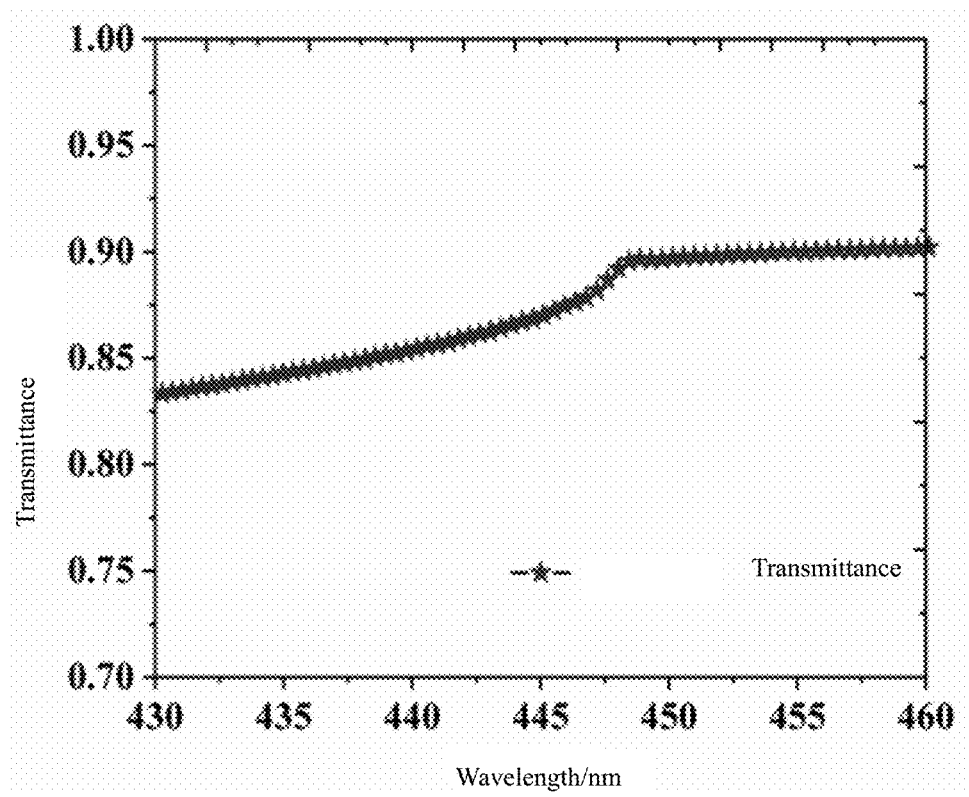

The photoresist is first spin-coated for 200 nm directly on a GaN film or GaN single crystal substrate grown on a sapphire substrate. A grating pattern having a period of 180 nm and a width of 110 nm is exposed using electron beam lithography or dual beam ultraviolet light and developed. Chromium metal is evaporated on the above-mentioned structure by electron beam evaporation or magnetron sputtering to a thickness of 50 nm, and the photoresist structure is removed by immersion in acetone and ultrasonic wave, and a grating width of chromium metal is 75 nm. The gallium nitride is etched with dry etching (ICP) to a depth of 185 nm and a width of 70 nm, and the residual chromium is washed away using a chromium etching solution. The transmission line and phase difference vs. amplitude ratios of the prepared gallium nitride supernano structure in the green wide spectral band are shown in FIG. 6a and FIG. 6b.

The present invention also provides a gallium nitride-based laser, comprising a gallium nitride-based laser body A and the above-mentioned gallium nitride nano superstructure B, wherein the gallium nitride nano superstructure B is arranged at a front end of a light-emitting end face of the gallium nitride-based laser body A, and an included angle between a line grating direction of the grating of the gallium nitride nano superstructure B and a polarization direction of the light-emitting of the gallium nitride-based laser body A is 45°. In the gallium nitride-based laser of the present invention, the radiation of left-handed polarized light and right-handed polarized light is realized by changing the angle between the line grating direction of the grating of the gallium nitride nano superstructure B and the polarization direction of the light emitted from the gallium nitride-based laser body A.

Figure 7:
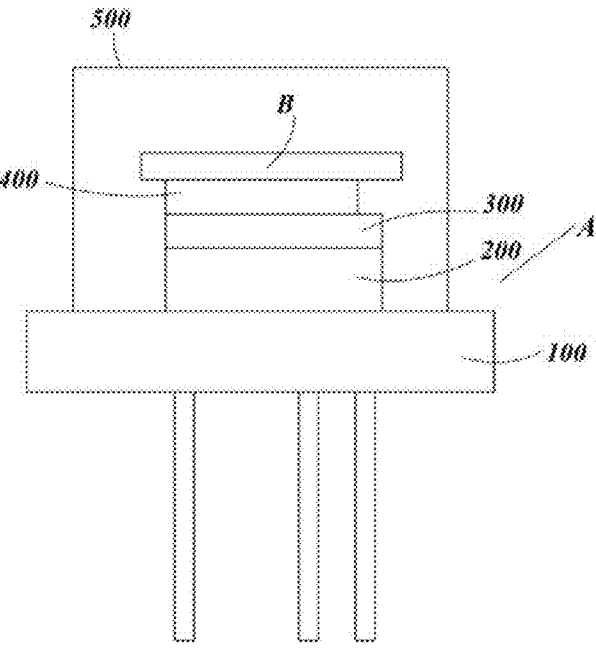
FIGS. 7-10 are schematic illustrations of the structure of gallium nitride-based lasers according to embodiments of the present invention (gallium nitride nano superstructures mounted at different locations).
Figure 8:
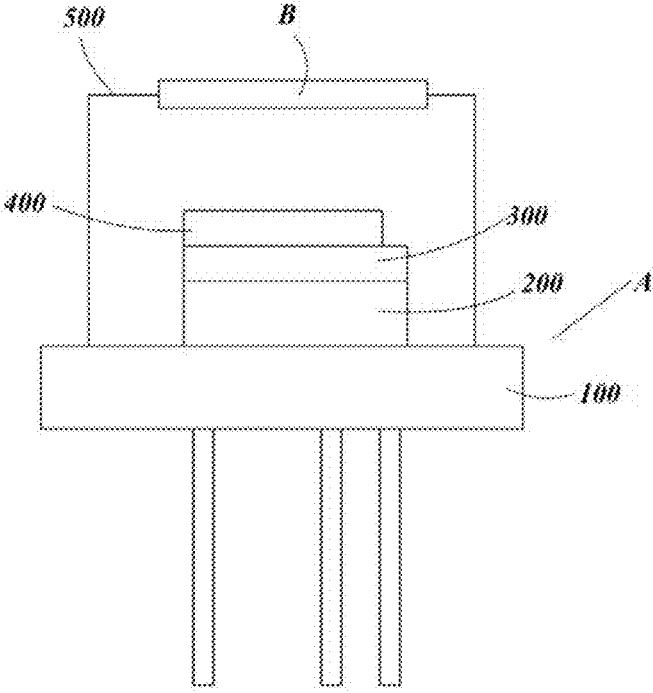
Figure 9:
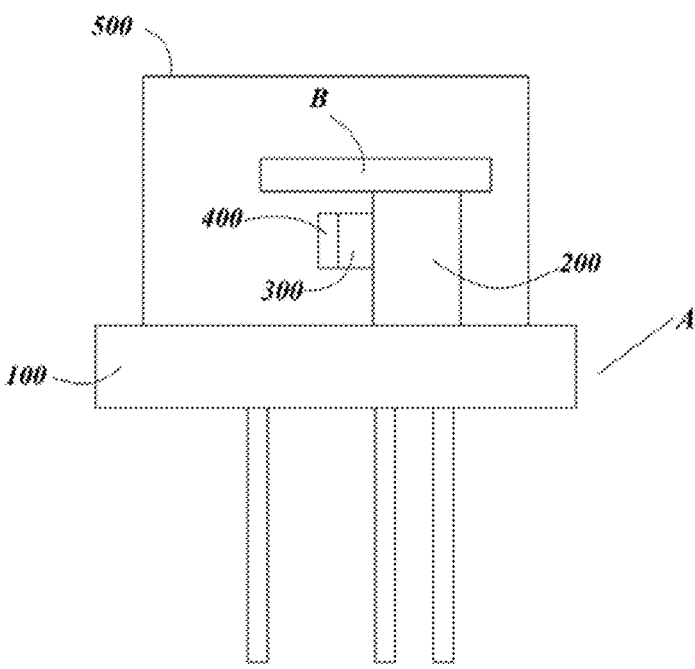
Figure 10:
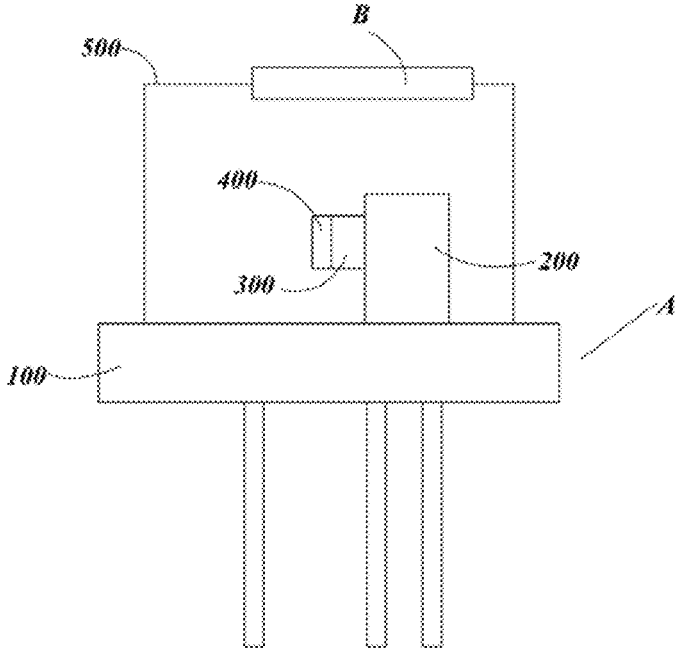

Gallium nitride-based laser body A includes die 100, heatsink 200, excess heatsink 300, LD chip 400, and package cap 500. The above-mentioned components may be combined to form a vertical cavity surface radiation laser (FIGS. 7 and 8) or an end surface radiation laser (FIGS. 9 and 10). In the case of a vertical cavity surface radiation laser, the gallium nitride nano superstructure B can be directly attached to the upper surface of the LD chip 400 (integrated on the inner radiation cavity surface of the device) or the top surface of the encapsulation cap 500, as shown in FIGS. 7 and 8. In the case of an end surface radiation laser, the gallium nitride nano superstructure B may be integrated on the heat sink 200 or on the top surface of the encapsulation cap 500, as shown in FIGS. 9 and 10.

The gallium nitride nano superstructure B and the gallium nitride-based laser body A are integrated into a front end of the light-emitting end face of the gallium nitride-based laser body A by means of bonding or optical bonding or combining with a light-emitting hole of an encapsulation cap, etc. In the integration, the gallium nitride nano superstructure B should be rotated by 45°, and if the grating prepared on the substrate has an angle of 45° with a straight edge of the substrate as shown in FIG. 2, it can be directly integrated on the front end of the laser radiation surface without the rotation direction.

Compared with the prior art, the gallium nitride nano superstructure of the embodiments of the present invention can achieve a high-efficiency circularly polarized light output function, and applying same to a gallium nitride-based laser can achieve the circularly polarized light output of the gallium nitride-based laser. Due to its own characteristics, gallium nitride-based lasers emit highly linearly polarized light. By integrating gallium nitride nano superstructure at the front end of the light-emitting surface and changing the positive and negative relationship between the nano-grating wire grid and the laser polarization direction, left-handed circularly polarized light and right-handed circularly polarized light are emitted.

The gallium nitride nano superstructures of the embodiments of the present invention have high light transmittance and high polarization conversion efficiency. There is no absorption of gallium nitride nano superstructure in the visible light band, and the preparation of nano-grating structure on the surface can effectively reduce the low light output efficiency caused by the large refractive index difference with air. Therefore, high transmittance can be achieved for the radiation of gallium nitride-based lasers. In addition, by designing reasonable nano superstructure parameters, the function of quarter-wave plate is realized, and the laser with high linear polarization degree is efficiently converted into circularly polarized radiation laser with minimal energy loss.

The gallium nitride nano superstructure of the embodiment of the present invention has a high degree of integration and a high stability. Gallium nitride nano superstructures, which are designed to have a nanostructure thickness on the order of a hundred nanometers, plus a substrate thickness on the order of a hundred micrometers, provide great convenience in achieving highly integrated compact devices. In addition, the gallium nitride material itself has high hardness, is resistant to radiation, is resistant to high temperature and is not easily decomposed, so the prepared gallium nitride nano superstructure has better stability and can maintain good physical properties under extreme conditions such as space, deep sea and high temperature environment.

The foregoing descriptions of specific exemplary embodiments of the present invention have been presented for purposes of illustration and example. It is not intended to limit the invention to the precise form disclosed, and obviously many modifications and variations are possible in light of the teaching. The exemplary embodiments are chosen and described in order to explain the specific principles and practical inventions of the present invention to enable one skilled in the art to make and use various exemplary embodiments of the present invention and various alternatives and modifications. It is intended that the scope of the present invention be defined by the claims and their equivalents.

What is claimed is:

1. A gallium nitride-based laser, comprising a gallium nitride-based laser body and a gallium nitride nano superstructure wherein the gallium nitride nano superstructure is arranged at a front end of a light-emitting end face of the gallium nitride-based laser body, and an included angle between a wire grid direction of the gallium nitride nano superstructure grating and a polarization direction of the light-emitting of the gallium nitride-based laser body is 45°;

wherein the gallium nitride nano superstructure is used for realizing circularly polarized light output of the gallium nitride-based laser, the gallium nitride nano superstructure comprising, from bottom to top: a substrate, a dielectric film layer and a nano-grating structure layer:

wherein a grating material of the nano-grating structure layer comprises one of gallium nitride, N-type gallium nitride and P-type gallium nitride, a grating period is in a range of 100 nm-280 nm, a grating height is in a range of 100 nm-300 nm, and a grating line width is in a range of 50 nm-200 nm.

2. The gallium nitride-based laser according to claim 1, wherein a substrate material of the gallium nitride nano superstructure comprises gallium nitride or sapphire.

3. The gallium nitride-based laser according to claim 1, wherein a material of the dielectric film layer of the gallium nitride nano superstructure comprises one of gallium nitride, N-type gallium nitride and P-type gallium nitride, and a thickness of the dielectric film layer ranges from 0.1 μm to 100 μm.

4. The gallium nitride-based laser according to claim 1, wherein the gallium nitride nano superstructure has a size of 10-1000 μm and a shape thereof comprises a circle or a square.

* * * * *